(12) United States Patent
Larson et al.

(10) Patent No.: US 10,483,920 B2
(45) Date of Patent: Nov. 19, 2019

(54) RIPPLE REDUCTION FILTER FOR CHOPPED AMPLIFIERS

(71) Applicant: Texas Instruments Incorporated, Dallas, TX (US)

(72) Inventors: Tony Ray Larson, Tucson, AZ (US); Dimitar Trifonov Trifonov, Vail, AZ (US); Biraja Prasad Dash, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/982,666

(22) Filed: May 17, 2018

(65) Prior Publication Data

US 2018/0337639 A1 Nov. 22, 2018

Related U.S. Application Data

(63) Continuation of application No. 15/467,417, filed on Mar. 23, 2017, now Pat. No. 10,003,306.

(51) Int. Cl.
*H03F 3/45* (2006.01)
*H03F 1/26* (2006.01)
*H03F 3/387* (2006.01)

(52) U.S. Cl.
CPC ............ *H03F 1/26* (2013.01); *H03F 3/387* (2013.01); *H03F 2200/171* (2013.01); *H03F 2200/271* (2013.01); *H03F 2200/375* (2013.01)

(58) Field of Classification Search
CPC .................................................. H03F 3/45892
USPC ...................................... 330/9; 327/124, 307
See application file for complete search history.

(56) References Cited

U.S. PATENT DOCUMENTS

| | | | |
|---|---|---|---|
| 5,862,460 A * | 1/1999 | Rich | H03G 3/3042 330/279 |
| 6,456,159 B1 | 9/2002 | Brewer | |
| 6,922,552 B2 * | 7/2005 | Noori | H03F 1/3223 330/149 |

(Continued)

FOREIGN PATENT DOCUMENTS

CN          103117713          5/2013

OTHER PUBLICATIONS

International Search Report in corresponding PCT Application No. PCT/US2018/023730, dated Aug. 16, 2018 (2 pages).

*Primary Examiner* — Henry Choe
(74) *Attorney, Agent, or Firm* — John R. Pessetto; Charles A. Brill; Frank D. Cimino

(57) ABSTRACT

Embodiments relate to a chopped amplifier system where a ripple reduction filter placed outside of a main signal path is disclosed. The chopped amplifier system includes a chopped amplifier having an input terminal and an output terminal, where the input terminal receives an input signal and the output terminal provides an output signal including a ripple that is based on an offset voltage of the chopped amplifier. The ripple reduction filter is placed in a feedback loop path that receives a portion of the chopped amplifier's output signal and provides a feedback signal to the chopped amplifier that reduces the ripple at the output of the chopped amplifier. The ripple reduction filter includes a digital controller and other circuits that can handle large disturbances such as large signal slew rate events and large common-mode steps without reducing the effectiveness of the ripple reduction filter in reducing the ripple.

19 Claims, 6 Drawing Sheets

(56) References Cited

U.S. PATENT DOCUMENTS

| | | |
|---|---|---|
| 7,425,821 B2 | 9/2008 | Monreal et al. |
| 8,829,988 B2 * | 9/2014 | Motz ...................... H03F 3/387 330/9 |
| 9,595,922 B2 * | 3/2017 | Maderbacher .......... H03F 3/387 |
| 2014/0139285 A1 * | 5/2014 | Maderbacher .......... H03F 3/387 330/9 |

* cited by examiner

RIPPLE REDUCTION FILTER FOR CHOPPED AMPLIFIERS

CROSS-REFERENCE TO RELATED APPLICATION

This application is a continuation of U.S. Nonprovisional patent application Ser. No. 15/467,417, filed Mar. 23, 2017, the entirety of which is incorporated by reference herein.

TECHNICAL FIELD

This disclosure relates to chopped amplifiers, and in particular to reducing ripple of chopped amplifiers by using ripple reduction filters.

BACKGROUND

Amplifiers used in applications such as pulse-width modulation (PWM) motor drive applications typically include characteristics such as precision, low noise, low offset, fast transient response and settling time, wide common-mode range, high common-mode rejection of both direct current (DC) and alternating current (AC) common-mode signals, and a minimal output glitch response to very fast and large common-mode signal steps. An example amplifier with such characteristics is a chopped amplifier (or chopper amplifier), which is a type of amplifier that typically reduces offset errors by using chopping techniques. Chopped amplifiers convert offset errors into an output ripple at the chopping frequency.

Conventionally, the output ripple is reduced using a ripple filter that is placed inline in the signal path of the chopped amplifier. Inline ripple filters typically reduce the speed of the chopped amplifier significantly because they act as a low pass filter to the signals processed by the chopped amplifier. To improve the speed of chopped amplifiers with inline ripple filters, a feed-forward path can be used to provide a high-frequency bypass signal path for the chopped amplifier. A drawback with adding the feed-forward path is an increased input capacitance that reduces the AC common-mode rejection ratio and also increases output glitches in response to common-mode transients.

BRIEF DESCRIPTION OF THE DRAWINGS

Particular embodiments in accordance with the disclosure will now be described, by way of example only, and with reference to the accompanying drawings:

FIG. 7 is identical to FIG. 6 except with a magnified scale for some waveforms to facilitate easier viewing of the details.

Other features of the present embodiments will be apparent from the accompanying drawings and from the detailed description that follows.

DETAILED DESCRIPTION

Embodiments of the present disclosure relate to a chopped amplifier system that include a ripple reduction filter for reducing the ripple of the chopped amplifier, where the ripple reduction filter is placed outside of a main signal path of the chopped amplifier. The chopped amplifier system includes a chopped amplifier having an input terminal and an output terminal, where the input terminal receives an input signal and the output terminal provides an output signal including a ripple that is based on an offset voltage of the chopped amplifier. The ripple reduction filter is placed in a feedback loop path that receives a portion of the chopped amplifier's output signal and provides a feedback signal to the chopped amplifier that reduces the ripple at the output of the chopped amplifier. The ripple reduction filter includes a digital controller and other circuits that can handle large disturbances without reducing the effectiveness of the ripple reduction filter in reducing the ripple. The chopped amplifier with the ripple reduction filter placed outside of the main signal path solves the problem of implementing a chopped amplifier with low offset and high AC common-mode rejection. Such a chopped amplifier has a fast transient response and has a wide common-mode range. The chopped amplifier reduces the offset errors even in the presence of large disturbances such as large signal slew rate events and large common-mode steps.

Figure 1:
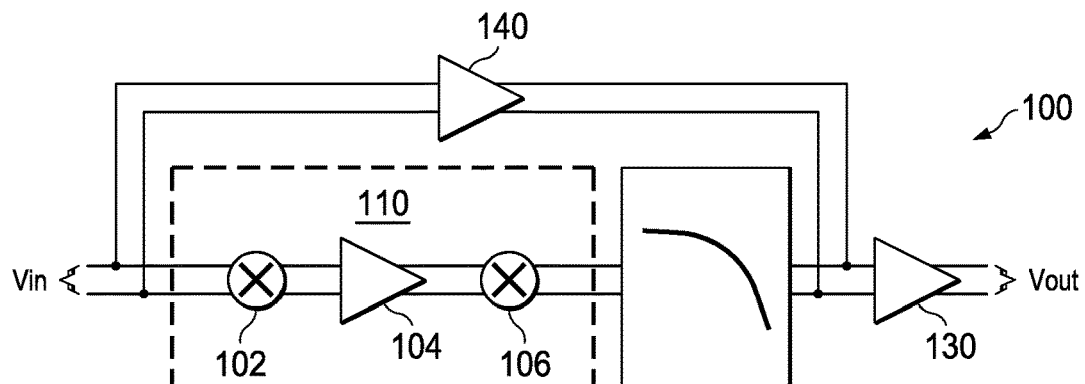
FIG. 1 is a block diagram of a conventional chopped amplifier with a ripple filter.

FIG. 1 a block diagram of a conventional chopped amplifier 100 with an inline ripple filter. The chopped amplifier 100 includes a chopped amplifier stage 110, a ripple filter 120, a feed-forward stage amplifier 140, and an output stage amplifier 130. The chopped amplifier 100 includes an input terminal Vin that receives an input signal at an input of the chopped amplifier stage 110 and an output terminal Vout that provides an output signal of the chopped amplifier 100. A chopped amplifier converts a DC noise component (e.g., offset error of the chopped amplifier 100) in to an AC output signal (i.e., ripple) at a chopping frequency. The DC noise component is different from a DC signal component that is part of the input signal of the chopped amplifier 100. For example, in fully differential circuits, the chopped amplifier converts the DC offset signal (i.e., the DC noise component) into a ripple on the output signal at the chopping frequency. A ripple filter is used to reduce the ripple caused by DC offset errors in the chopped amplifier input stage 104. The chopped amplifier stage 110 includes an amplifier 104 and switches 102 and 106 that are used for chopping the DC offset component of the amplifier into an AC signal.

In the conventional chopped amplifier 100, ripple filter 120 is placed within the signal path (i.e., inline) in between the chopped amplifier stage 110 and output amplifier 130. The inline ripple filter 120 that reduces the output chopping ripple (also referred to as "output ripple" or simply "ripple") typically slows the response of the chopped amplifier 100 significantly because the ripple filter 120 acts as a low pass filter to the signal. One method to provide a high frequency signal path includes adding a feed-forward stage amplifier 140 as shown in FIG. 1 to bypass the low frequency signal path that includes the inline ripple filter 120. A drawback with adding a feed-forward stage amplifier 140 is the increased input capacitance for the chopped amplifier 100 and thereby significantly reducing an AC common-mode rejection ratio (CMRR). A reduced CMRR results in increased glitches due to common-mode transient events such as changing common-mode voltage of the input signal. Accordingly, a chopped amplifier without an inline ripple filter (that necessitates a feed forward stage) is desirable to maintain a fast transient response of the chopped amplifier signal path. An example chopped amplifier without an inline ripple filter is discussed below with reference to FIG. 2.

Figure 2:
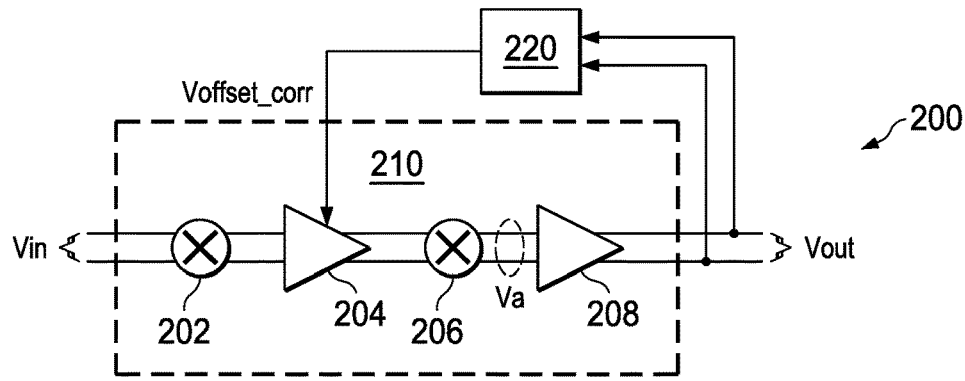
FIG. 2 is a block diagram of a chopped amplifier with a ripple reduction filter placed outside of the signal path, according to one embodiment.

FIG. 2 is a block diagram of a chopped amplifier 200 with a ripple reduction filter, according to one embodiment. The chopped amplifier 200 includes a chopped signal path 210 and a ripple reduction filter 220 that is outside of the chopped signal path 210. By placing the ripple reduction filter 220 outside of the chopped signal path 210, the chopped signal path 210 is not bandwidth limited by an inline ripple reduction filter (as was the case in conventional chopped amplifier 100 in FIG. 1) and the chopped amplifier 200 can operate at the maximum speed supported by the chopped signal path 210. Another observation is that, unlike in the conventional chopped amplifier 100 of FIG. 1, when the ripple reduction filter 220 is placed outside of the main signal path as in FIG. 2, the chopping frequency has little effect on the bandwidth of the chopped amplifier 200. Accordingly, the chopping frequency can be chosen inside of the bandwidth of the chopped signal path 210. This results in faster settling times and wider bandwidths for the chopped amplifier 200 without having to use a feed-forward stage amplifier.

The chopped signal path 210 includes an input terminal Vin that receives an input signal and an output terminal Vout that provides an output signal of the chopped amplifier 200. The chopped signal path includes an input amplifier stage 204, an output amplifier stage 208, and switches 202 and 206 (which may alternatively be referred to as modulators 202 and 206 or choppers 202 and 206). For example, switch 202 may be referred to as modulator and switch 206 as demodulator. The switches 202 and 206 are used for chopping the DC error of amplifier 204 into an AC signal (i.e., a ripple signal) at the output terminal. Ripple reduction filter 220 is coupled with the output terminal Vout and receives the ripple signal of the output signal of the chopped amplifier 200 as its input signal. The ripple reduction filter 220 processes the ripple signal and generates a DC signal (for reducing the DC offset error of the amplifier stage 204) that is fed back to the chopped signal path 210 to reduce the DC offset error of amplifier 204 and hence the ripple signal of the output signal. For example, the output of the ripple reduction filter 220 is coupled to an offset correction terminal of the amplifier stage 204 (i.e., Voffset_corr). The operation of the ripple reduction filter 220 is described further below with reference to FIG. 3.

While ripple reduction filter 220 is designed to process the ripple signal of the output signal, it might be difficult for the ripple reduction filter 220 to distinguish between ripple due to offset chopping and other intended signals passing through the chopped amplifier 200. For example, disturbances to the chopped amplifier 200, as well as certain types of user signals (i.e., signals that chopped amplifier 200 is designed to process) passing through the chopped amplifier 200 may "fool" the ripple reduction filter 220 into responding as though the disturbance is chopping ripple and thereby reduce the effectiveness of the ripple reduction filter 220. In some cases, signals passing through the chopped amplifier 200 may even cause the ripple reduction filter 220 to increase the chopped amplifier's output ripple. Examples of these types of signals include: 1) input signals such as square waves, at, or close to the chopping frequency; 2) large and fast common-mode steps that cause the chopped amplifier 200 to glitch; and 3) signals with large slew rate (e.g., high dv/dt). In some embodiments where there are no disturbances and with shorted inputs (i.e., input signal=0), the output ripple of the chopped amplifier 200 can be as low as less than 50 nV. If a large scale disturbance such as a 5V square wave signal whose amplitude is 100,000,000 times larger than the residual chopping ripple of 50 nV occurs at the same time when the ripple reduction filter 220 is processing the output ripple, the true offset value of the chopped amplifier 200 will be completely lost and the ripple reduction filter 200 will possibly increase the output ripple instead of reducing it. To be able to handle such disturbances, a ripple reduction filter 220 is designed to observe all of the signals including the disturbances, to process only the chopping ripple, and to attenuate virtually all other signals. An example ripple reduction filter 220 is described below with reference to FIG. 3.

Figure 3:
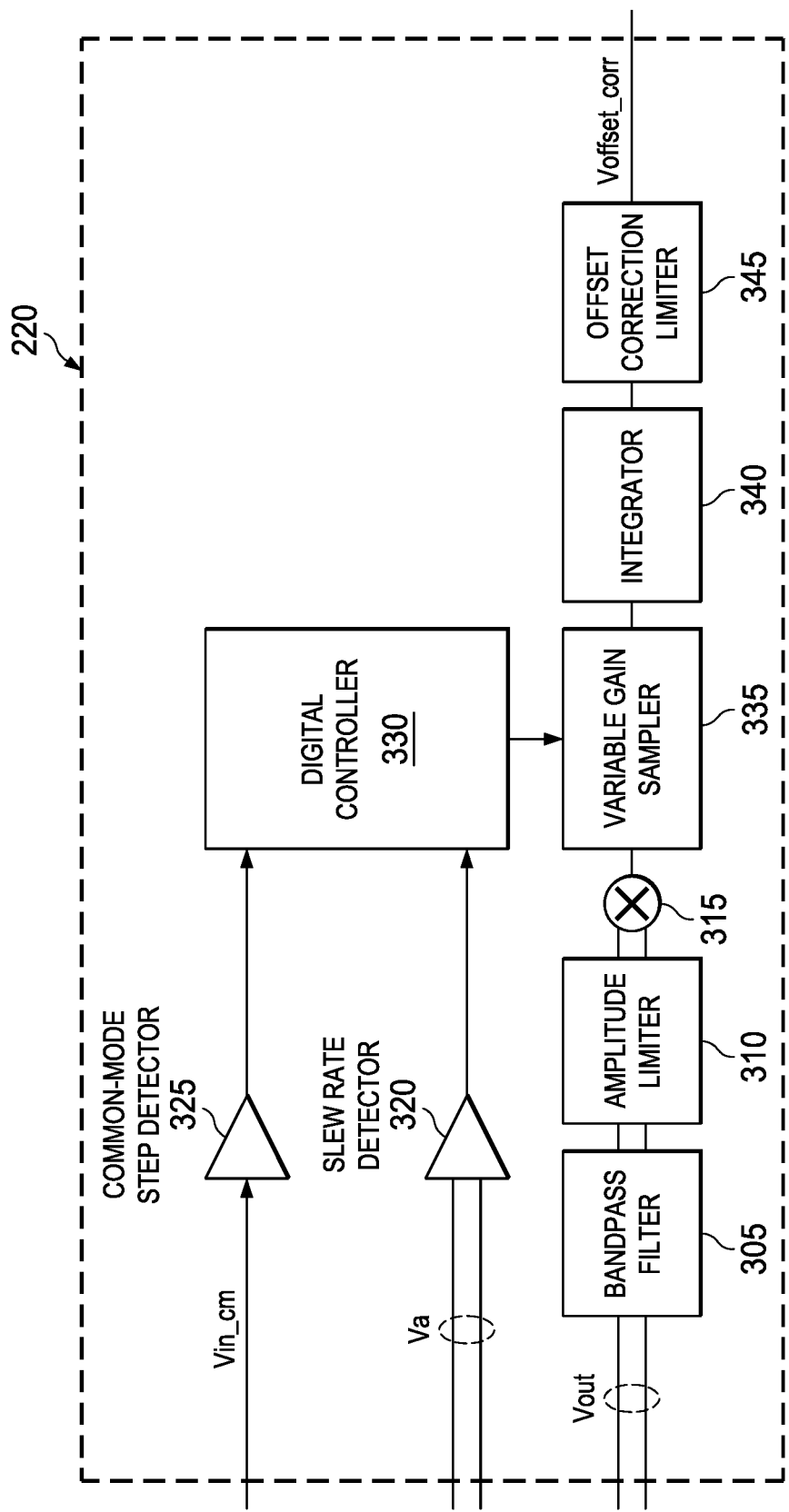
FIG. 3 is a block diagram of the ripple reduction filter of FIG. 2, according to one embodiment.

FIG. 3 is a block diagram of the ripple reduction filter of FIG. 2, according to one embodiment. FIG. 3 shows an architecture of the ripple reduction filter 220 that includes multiple steps of filtering and multiple domains of isolation for detecting the chopping ripple and for rejecting other signals. The ripple reduction filter 220 includes a bandpass filter 305 for attenuating signals outside of a chopping frequency range; an amplitude limiter 310 for attenuating or soft-clipping signals larger than the expected maximum chopping ripple amplitude; a slew rate detector 320 for detecting large signal events with high slew rate; a common-mode step detector 325 for detecting large signal common-mode steps; a switch 315 for converting the AC chopping ripple into a DC signal that may be sampled by variable gain sampler 335; a variable gain sampler 335 for sampling the chopping ripple signal; a digital controller 330 for controlling a mode of operation of the variable gain sampler 335; an integrator 340 for integrating the sampled output of the variable gain sampler 335; and an offset correction limiter 345 for operating as a failsafe limiter such that the output ripple correction signal cannot exceed a predetermined value. Each of the circuits, the bandpass filter 305, the amplitude limiter 310, the slew rate detector 320, the common-mode step detector 325, the variable gain sampler 335, the smart digital controller 330, the integrator 340, and the offset correction limiter 345 may be implemented using any combination of analog and digital circuitry.

The bandpass filter 305 is designed to be centered at the chopping frequency to attenuate signals outside of the chopping frequency range. For example, if the chopping frequency is selected as 200 kilohertz (kHz) and a range of chopping frequencies are chosen as between 150 to 250 kHz, the bandpass filter 305 would be designed to attenuate signals outside of the frequency range of 150 to 250 kHz. The bandpass filter 305 receives the output signal (or a portion of the output signal) Vout of the chopped amplifier 200 and filters the received signal. By passing the chopped amplifier's output signal Vout through the bandpass filter 305, the range of signals that can cause problems for the ripple reduction filter 220 reduces and the amplitude of all remaining interfering signals except for those occurring at the chopping frequency also reduces. In some embodiments, the clocking signal corresponding to the chopping frequency is generated using spread spectrum techniques. In such embodiments, all chopping switches, sampling events, and filters are synchronized to the spread spectrum clock including the bandpass filter 305, if the bandpass filter 305 is implemented as a switch capacitor filter. Alternatively, if the bandpass filter 305 is implemented as an analog filter, the bandpass filter 305 is designed with sufficient bandwidth to pass the spread spectrum chopping clock.

Figure 4:
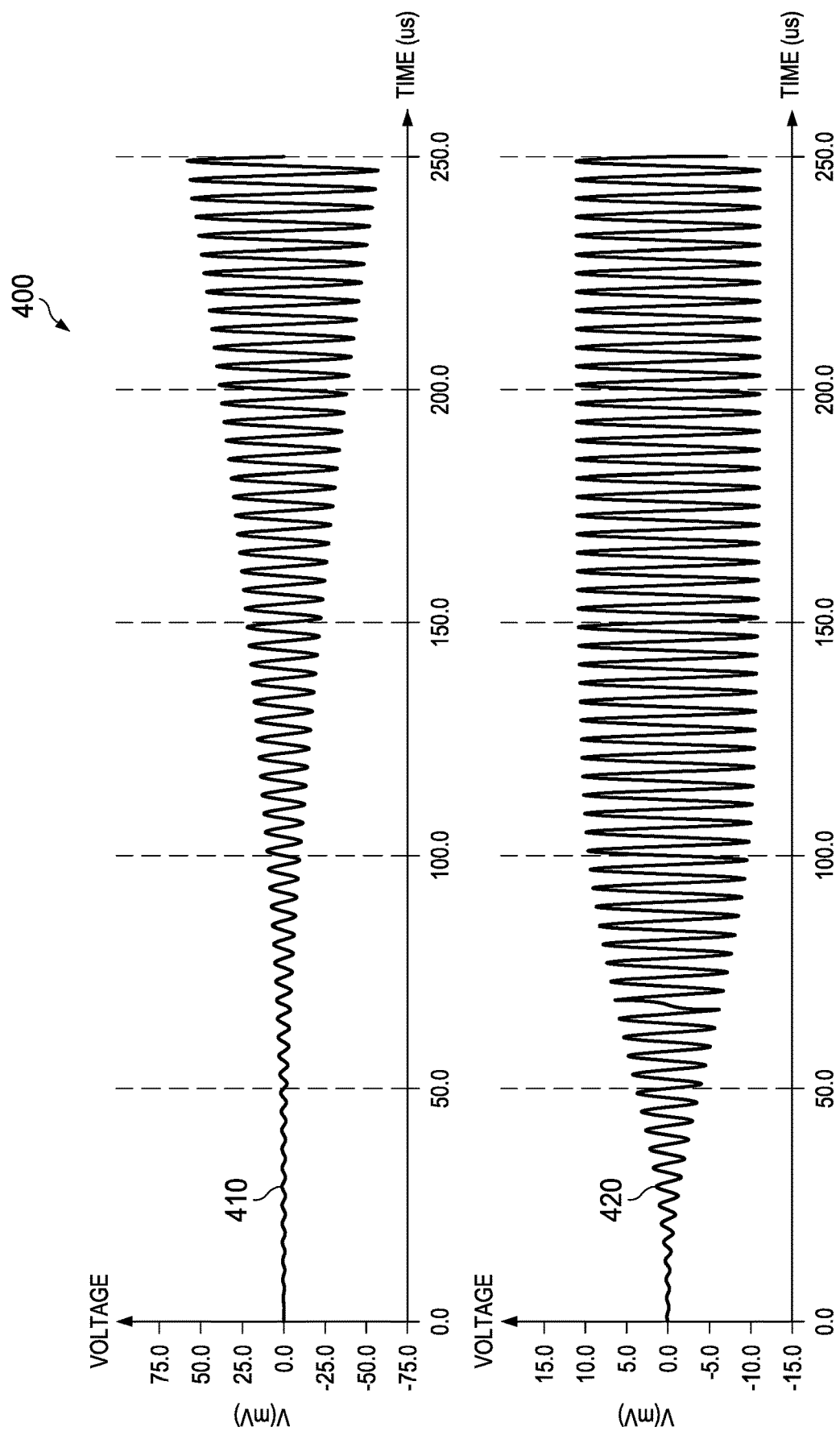
FIG. 4 depicts input and output waveforms of an amplitude limiter of FIG. 3, according to one embodiment.

The output signal of the bandpass filter 305 is provided as an input signal to the amplitude limiter 310. The amplitude limiter 310 attenuates or soft-clips signals that are larger than a threshold amplitude. In some embodiments, the threshold amplitude is an expected maximum chopping ripple amplitude of the chopped amplifier 200. An operation of the amplitude limiter 310 is depicted in FIG. 4. FIG. 4 is a timing diagram illustrating an operation of the amplitude limiter 310, according to one embodiment. In FIG. 4, the x-axis represents time and the y-axis represents voltage of the signals. FIG. 4 shows an input signal 410 to the amplitude limiter 310 and an output signal 420 of the amplitude limiter 310. As depicted in FIG. 4, the amplitude limiter 310 provides gain for small signals up to 10 mv but saturates signals greater than 10 mv. For example, at a time of 50 us, the output signal 420 is gaining the input signal 410 to about 5 mv but as the input signal 410 is growing in amplitude the output signal 420 reaches 10 mv and saturates or soft-clips at 10 mv. This can be seen at a time of 200 us, where the input signal is about 30 mv but the output signal is soft-clipped to 10 mv. Accordingly, even the largest disturbances are limited to 10 mv peak maximum. For example, as described earlier, when a 5 v square wave at the chopping frequency is passing through the chopped amplifier 200, while the bandpass filter 305 would pass the signal almost as-is, the amplitude limiter 310 attenuates the 5V signal down to 10 mV reducing its effect on the filter by 500 times.

Referring back to FIG. 3, the slew rate detector 320 detects disturbances that include large signal high slew rate events (i.e., high dv/dt events) that reduce the effectiveness of the ripple reduction filter 220. Even though the large signal high slew rate events are attenuated when passing through the amplitude limiter 310, large events such as an edge of a 5 v square wave may disturb the output of the ripple reduction filter 220 and still cause errors in the ripple reduction. So, it is important to detect such disturbances and handle them as discussed below in addition to the amplitude limiting discussed above.

In some embodiments, the slew rate detector 320 receives a differential signal input Va from an input to the output amplifier stage 208 of FIG. 2. Alternatively, the slew rate detector 320 receives the differential signal from another point of the chopped signal path 210. In some embodiments, the slew rate detector 320 includes a differential comparator to detect events that are large enough and fast enough to cause the chopped amplifier 200 to slew. Under normal operation (i.e., when no disturbances are present), the differential inputs to the output amplifier stage 208 are nearly identical (i.e., a virtual short across these inputs). When a large high dv/dt differential signal is introduced in the chopped amplifier 200, the virtual short conditions are no longer valid and a relatively large differential voltage spike appears across these inputs that drive the output amplifier stage to slew its outputs quickly. If the differential dv/dt event is larger than a threshold slew rate (i.e., threshold dv/dt value), the slew rate detector 320 detects it.

The slew rate detector 320 provides an output signal to the digital controller 330 indicating whether a large signal high slew rate event is detected. In some embodiments, when a large signal high slew rate event is detected, the digital controller 330 controls the variable gain sampler 335 to operate the variable gain sampler 335 in a blanking mode such that the variable gain sampler 335 is not sampling the chopping ripple signal for a period of time that is long enough to allow the chopped amplifier 200 to settle in response to the large signal high slew rate event. The blanking mode ensures that the ripple reduction filter 220 is not processing the output of the chopped amplifier 200 when the chopped amplifier 200 is responding to the large signal high slew rate event to minimize any error associated with such a disturbance. The operation of the digital controller 330 and the variable gain sampler 335 are described further below.

The common-mode detector 325 detects disturbances that include large signal common-mode input steps that reduce the effectiveness of the ripple reduction filter 220. Similar to the large signal high slew rate events discussed above, it is important to detect disturbances such as large signal common-mode input steps and handle them as discussed below. The common-mode detector 325 receives a common-mode signal Vin_cm of the input Vin of the chopped amplifier 200 and provides an output signal to the digital controller 330 indicating whether a large signal common-mode input step is detected. The common-mode signal Vin_cm of the input signal Vin may be generated using analog circuitry.

In some embodiments, the common-mode detector 325 includes a common-mode comparator to detect common-mode steps that are large enough and fast enough to change the biasing and the output response of the chopped amplifier 200. When a large signal common-mode input step occurs, the chopped amplifier 200 may momentarily "glitch" due to disruptions of its biasing network. If this glitch is allowed to pass through the ripple reduction filter 220, large errors may occur to the offset correction of the chopped amplifier 200. If the common-mode step is larger than a threshold common-mode step, the common-mode detector 325 detects it. In some embodiments, when the common-mode detector 325 detects a large signal common-mode input step and provides an indication of such detection to the digital controller 330, the digital controller 330 controls the variable gain sampler 335 to operate the variable gain sampler 335 in the blanking mode similar to the high slew rate event detection discussed above. The chopped amplifier 200 settling time may be different for common-mode glitches than it is for high slew rate signal events. Accordingly, the blanking times used in response to large signal common-mode input step detection may be different from that of high slew rate event detection. The operation of the digital controller 330 and the variable gain sampler 335 are described further below.

The digital controller 330 receives input signals from the common-mode detector 325 and the slew rate detector 320 indicating whether a large signal common-mode input step or a large signal high slew rate event respectively were detected, and provides output signals to the variable gain sampler 335 to set a mode of operation for the variable gain sampler 335. The variable gain sampler 335 receives the output signal from the amplitude limiter 310 which is converted to DC by switch 315 and samples and holds the signal until the digital controller 330 sets the variable gain sampler 335 in an appropriate mode to provide the sampled signal to the integrator 340 for further processing. The digital controller 330 can control the variable gain sampler 335 in one of the three modes of operation: 1) a blanking mode for rejecting the disturbance energy; 2) a high gain mode for normal operation of the ripple reduction filter 220; and 3) a low gain mode that serves as a transition mode between the blanking mode and the normal mode. It is understood that the mode of operation of the variable gain sampler 335 is the same as a mode of operation of the ripple reduction filter 220.

The variable gain sampler 335 is operated synchronous to the chopping frequency and the sampled output is not provided to the integrator 340 until the digital controller 330 allows the variable gain sampler 335 to provide it at the beginning of the next clock cycle of the chopping frequency (i.e., next chopping clock). Accordingly, any disturbance energy that passes the bandpass filter 305 and the amplitude limiter 310, and reaches the variable gain sampler 335 before the digital controller 330 is aware of such disturbance resides only on the variable gain sampler 335's capacitors but is not passed to the integrator 340. An example block diagram of a variable gain sampler 335 and integrator 340 of FIG. 3 are shown in FIG. 5.

Figure 5:
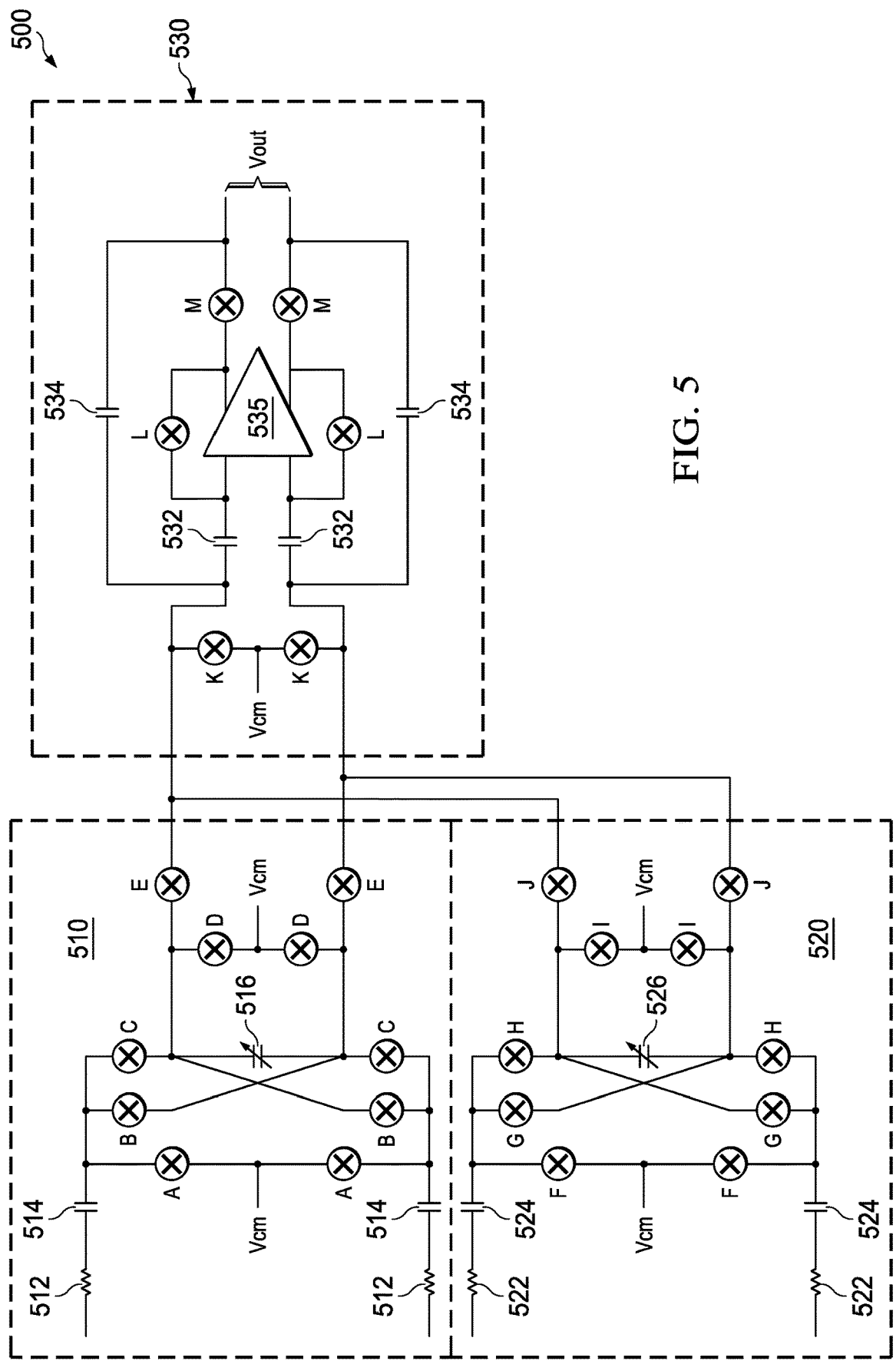
FIG. 5 is a block diagram of a variable gain sampler and integrator of FIG. 3, according to one embodiment.

FIG. 5 is a schematic diagram 500 illustrating an example implementation of the variable gain sampler 335 and the integrator 340 of FIG. 3. In FIG. 5, the variable gain sampler of FIG. 3 is implemented with two sampler circuits 510 and 520. Alternatively, the variable gain sampler 335 may include only one sampler circuit 510. The sampler circuits 510 and 520 receive inputs from the output of amplitude limiter 310 and a switching network 315. The switching network 315 synchronously samples the AC ripple at the chopping frequency to extract the ripple and rectify it to a DC signal that may be integrated. In other words, the switching network 315 in effect "unchops" the ripple. The "unchopped ripple" is stored on capacitor 516 (or capacitor 526). If the digital controller 330, determines that a blanking period is in effect, it throws this sampled ripple away. The sampled charge on capacitors 516/526 is "thrown away" by simply not passing it on to the integrator 530. In other words switches E or J never pass charge to the integrator 530 when the sampler is in blanking mode. Instead switches D or I are turned on to discharge capacitors 516/526 in the blanking mode. Otherwise, the digital controller 330 allows the rectified ripple energy stored on capacitor 516 to be integrated on to capacitors 534 in integrator 530. The sampler circuits 510 and 520 alternate sampling/rectifying ripple and passing it on to the integrator as described below.

The sampling circuit 510 includes resistors 512, capacitors 514 and 516, and multiple switches (labeled A through M) for sampling the chopping ripple signal after passing through the bandpass filter 305 and the amplitude limiter 310. The sampling circuit 520 includes resistors 522, capacitors 524 and 526, and multiple switches A-M for sampling the chopping ripple signal after passing through the bandpass filter 305 and the amplitude limiter 310. The switches A-M may be different from switches used in switching network 315, and switches 202 and 206. While the sampling circuits 510 and 520 receive the same input signals, the switches A-M located in each of the sampling circuits are controlled by different phases of the chopping clock signal. The chopping ripple signal is sampled and the sampled signal is not provided to the integrator 530 until the digital controller 330 provides the appropriate mode control signal (e.g., low gain mode or high gain mode) to the variable gain sampler 335 and the integrator 340. After receiving the appropriate mode control signal, the integrator 340 integrates the sampled chopping ripple signal at the beginning of the next chopping clock cycle. The integrated output signal is then provided to the offset correction limiter 345.

The sampling circuits 510 and 520 alternate sampling and feeding the integrator 530. While one sampling circuit samples, the other sampling circuit feeds its previously sampled value to the integrator. For example, an operation of sampling circuit 510 is described now. The sampling circuit 510 begins its sampling period by closing switches A and D. That empties capacitor 516 of all previous charge and initializes capacitors 514 to the current DC level. Switches A and D are then opened. Switches B and C are then closed in sequence synchronously with the chopping clock. By closing switches B and C in sequence, the ripple is sampled and stored on to capacitor 516 while simultaneously converting it to DC (i.e., the positive half cycle of the ripple is sampled through switch C and the negative half cycle is sampled through switch B). Switches A, B, C, and D are then opened—ending the sampling period for sampling circuit 510. The integration period begins with the integrator 530 zeroing its input capacitors 532. This zeroing is done by opening switch M and closing switches K and L. The integrator 530 then prepares to accept charge by opening switches K and L and by closing switch M. The charge that is stored on capacitor 516 (representing one cycle of ripple energy) is then integrated onto capacitor 534 by closing switch E. The integration period for sampling circuit 510 ends by opening switch E. It is understood that the sampling circuit 520 operates similar to the operation of the sampling circuit 510 described above except that when the sampling circuit 510 is sampling, the sampling circuit 520 feeds its previously sampled value to the integrator 530. Similarly, when the sampling circuit 510 is feeding its previously sampled value to the integrator 530, the sampling circuit 520 is sampling.

The difference between high gain and low gain mode is the size of capacitors 516 and 526. These capacitors are actually made up of multiple capacitors in parallel with additional switches connecting them together. All segments of these capacitors always participate in the sampling period. However in low gain mode, only a small portion of the capacitor (a small segment) is used during the integration period. Hence only a small portion of the sampled ripple energy is integrated, resulting in lower gain. That is how capacitors 516 and 526 act like variable sized capacitors.

In blanking mode, switch E (and equivalently switch J) is opened, and therefore the charge collected on capacitors 516 or 526 for a particular cycle does not get integrated onto capacitors 534. The charge stored on capacitors 516 or 526 is discharged from the capacitors 516 or 516 when switches D or I are closed in the next clock period.

Referring back to FIG. 3, the digital controller 330 controls the variable gain sampler 335 by placing the variable gain sampler 335 in a blanking mode for rejecting the disturbance energy in response to detecting at least a large signal high slew rate event and/or a large signal common-mode step. In the blanking mode, the variable gain sampler 335 does not provide new inputs to the integrator 340, and hence the amplifier offset control signal Voffset_corr does not change during the blanking time. For example, variable gain sampler holds the same value on the input of the integrator 340 as that which was held on the input immediately prior to entering the blanking mode. That is, the feedback signal (i.e., offset control signal Voffset_corr) to the chopped amplifier 200 does not change its value during the blanking mode. In some embodiments, the chopped amplifier 200 settling time in response to a large signal high slew rate event is different from that of a large signal common-mode step. Accordingly, the duration of the blanking mode may be different in response to a large signal high slew rate event as compared to that of a large signal common-mode step. For example, the blanking mode duration in response to a large signal high slew rate event may be larger than that of a large signal common-mode step as discussed further below with reference to timing diagrams of FIGS. 6 and 7. When digital controller 330 blanks the ripple signal (i.e., puts the variable gain sampler 335 in blanking mode), the variable gain sampler 335 throws this disturbance away (e.g., by discharging charge stored on capacitors 516 or 526 by closing switches D or I as described above with reference to FIG. 5), along with any additional disturbances that result from the chopped amplifier 200 settling back into normal operation. This provides nearly complete isolation of the ripple reduction filter 220 output to infrequent high slew rate events or large common-mode steps and allows the ripple reduction filter 220 to continue feeding back the proper chopped amplifier 220 offset correction value in the presence of such disturbances.

As the chopped amplifier 200 settles from the disturbances describe above, the digital controller 330 allows the variable gain sampler 335 to resume sampling, first in a low gain mode and later in a high gain mode after the chopped amplifier 200 completely settles to its normal operation. The digital controller 330 provides a low gain sampling mode to allow the ripple reduction filter 220 to quickly begin working again after the blanking mode even before the chopped amplifier 200 has fully settled to its normal operation. When the variable gain sampler 335 is operating in the low gain mode, the feedback loop (that includes the ripple reduction filter 220) is closed with minimal disturbance to the output of the ripple reduction filter 220. When the chopped amplifier 200 completely settles back to its normal operation, the digital controller 330 places the variable gain sampler 335 in the high gain mode. An example operation of the variable gain sampler 335 in all three modes is described further below with reference to timing diagrams of FIGS. 6 and 7.

It is important that the ripple reduction filter 220 not be blanked continuously as the feedback loop would then cease to function (as it would effectively run open loop) and eventually provide no correction for the chopped amplifier's offset. In some applications, it is possible for the rate of common-mode glitches and/or high slew rate events to be so high that the blanking periods might overlap and effectively turn off the ripple reduction filter 220 for long periods of time. Such a scenario might happen, for example, when a user PWM operation including quickly repeated common-mode steps is combined with a high frequency repetitive high slew rate input signal (e.g. square waves or full power sine waves). In such a scenario, the ripple reduction loop (i.e., the feedback loop including the ripple reduction filter 220) would constantly blank events and essentially run open loop (by freezing the output of ripple reduction filter 220) providing no benefit to the chopped amplifier 200 in reducing its offset. To ensure that the ripple reduction filter 220 remains in a closed loop operation, the digital controller 330 may use an algorithm that limits the number of consecutive blanking periods. It can intelligently control the variable gain sampler 335 in the various operation modes such that it limits the duration for which the ripple reduction loop effectively stays in an open loop operation by trading off the amount of disturbance energy to be rejected with the duration of effectively staying in the open loop operation.

The offset correction limiter 345 operates as a failsafe limiter such that the output ripple cannot exceed a predetermined value under any condition. It is possible for an input signal Vin to have so many large slew rate events and common-mode steps in rapid succession that the digital controller 330 is forced to pass some of the disturbance energy through the variable gain sampler 335 to avoid operating the chopped amplifier 200 effectively in open loop (i.e., with the ripple reduction filter 220 in blanking mode) for extended periods of time. To handle such scenarios, the absolute range of the output signal of the ripple reduction filter 220 (i.e., offset correction signal Voffset_corr) is limited such that the ripple reduction filter 220's contribution to output ripple cannot exceed a predetermined value under any condition.

The offset correction limiter 345 receives the output signal of the integrator 340 as an input signal and provides the offset correction signal Voffset_corr to a control signal of the chopped amplifier 200 that controls the DC offset of the chopped amplifier 200. For example, the offset correction limiter 345 provides the offset correction signal Voffset_corr to the input amplifier stage 204 to modify the DC offset of the input amplifier stage 204. When many large slew rate events and common-mode steps occur in rapid succession, the bandpass filter 305, amplitude limiter 310, and variable gain sampler 335 greatly reduce the disturbance energy that pass through the filter. However, when such events occur for extended periods of time, the ripple reduction filter 220 may still accumulate significant error before reaching an equilibrium state. The failsafe limit of offset correction limiter 345 bounds the error that the ripple reduction filter 220 is allowed to feedback to the chopped amplifier 200 in these worst case conditions. In some embodiments, the failsafe limit may be made very small by trimming the native offset of the chopped amplifier 200 under nominal conditions. For example, the maximum offset of the chopped amplifier 200 that needs to be cancelled by the ripple reduction filter 220 is the amount of drift of the chopped amplifier 200's offset over temperature and supply variations. As the drift of the trimmed chopped amplifier 200's offset can be much smaller than its original offset distribution, the required range of the ripple reduction filter 220's correction is reduced substantially. Under typical conditions the ripple reduction filter 220 drives the output ripple below the noise level of the chopped amplifier 200. Under worst case conditions as described above, the failsafe limit ensures that the chopping ripple cannot grow more than the drift amount of offset for the chopped amplifier 200. Since the worst case conditions require large signal disturbances on the chopped amplifier 200's inputs, the small amount of failsafe ripple that reaches the chopped amplifier 200's output signal is typically insignificant relative to the large signal disturbances.

Figure 6:
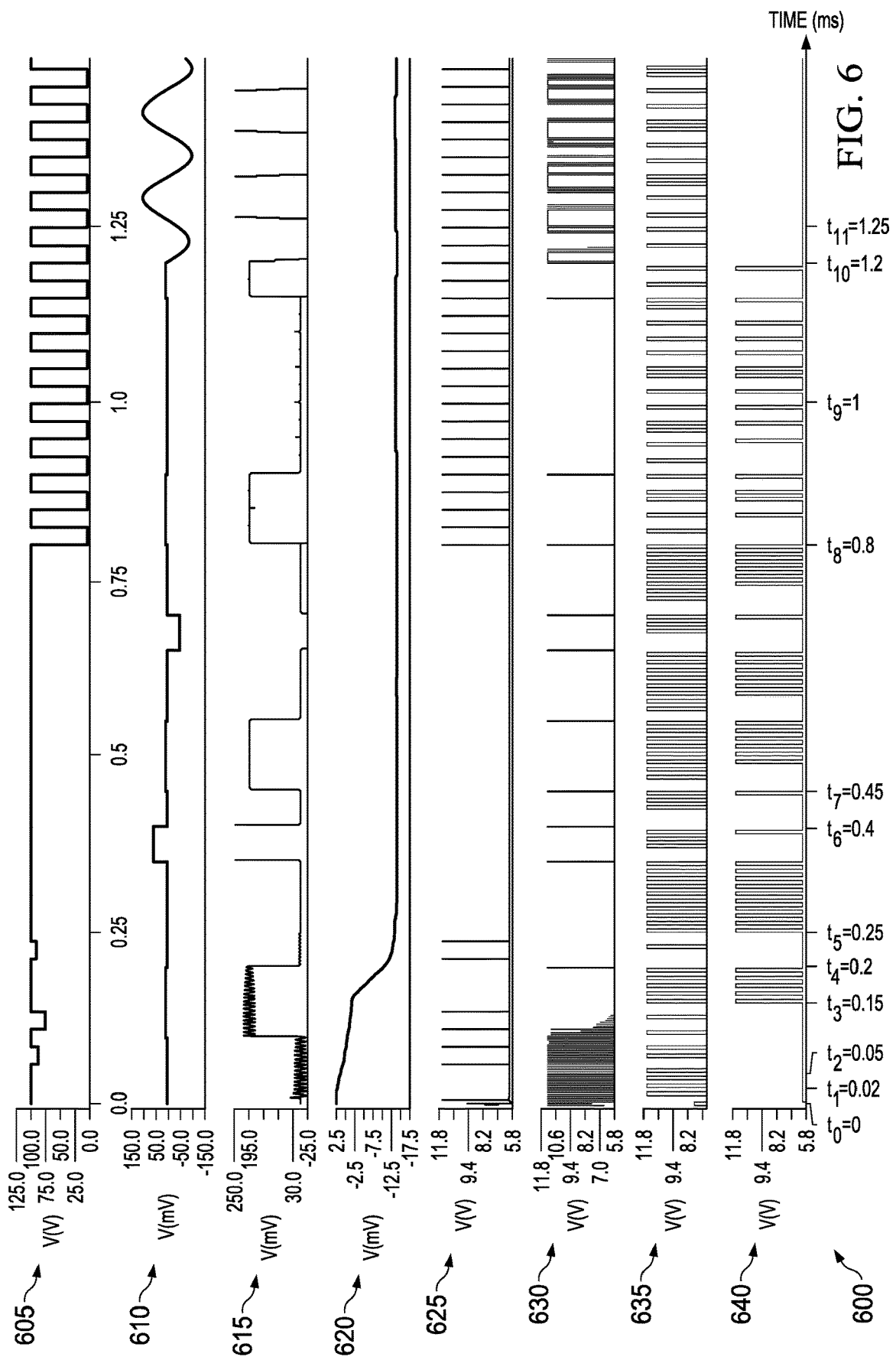
FIG. 6 is a timing diagram illustrating an operation of the ripple reduction filter of FIG. 3, according to one embodiment.
Figure 7:
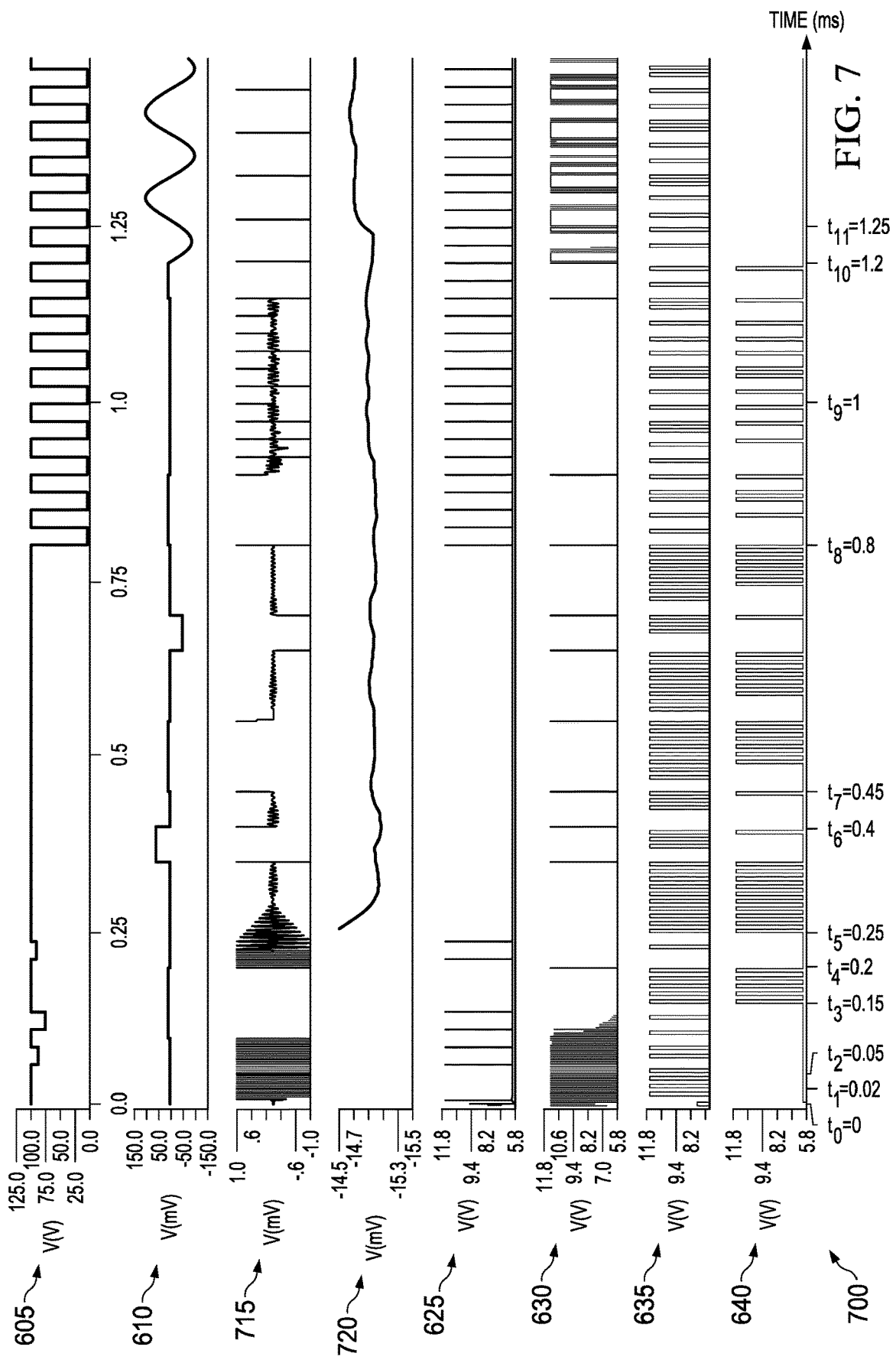
FIG. 7 is another timing diagram illustrating an operation of the ripple reduction filter of FIG. 3, according to one embodiment.

FIGS. 6 and 7 are timing diagrams illustrating an operation of the ripple reduction filter 220 of FIG. 3, according to one embodiment. In FIGS. 6 and 7, x-axis represents time and y-axis represents voltage of various signals. FIGS. 6 and 7 show the results of a typical simulation of a chopped amplifier 200 running through several hundred chopping clock cycles with a ripple reduction filter 220. The simulation results are shown for an example case where the gain of the chopped amplifier 200 is set to 20, operating at a chopping frequency of 200 kHz, and with an offset added to the input stage for simulation purposes. The waveforms of FIGS. 6 and 7 show how the chopped amplifier 200 with the ripple reduction filter 220 responds to various disturbances as described above with reference to FIGS. 3 through 5.

FIG. 6 shows the common-mode input signal to the chopped amplifier 200 as trace 605, which includes several common-mode steps of various sizes, ending with a continuous train of 100 v steps starting at time=800 us. Trace 610 shows the input differential mode signal to the chopped amplifier 200 that includes several differential steps of various sizes, ending with several cycles of a full-scale sine wave starting at time=1.2 ms. Trace 615 shows part of the output signal of the chopped amplifier 200 that is zoomed in to about 250 mv to show the ripple on top of the output signal. The initial chopping ripple of the chopped amplifier 200 is clearly visible during the first 200 us of the simulation as the integrator 340 begins to acquire the offset correction value required to eliminate the ripple. Some of the common-mode step glitch effects may also be seen on this output signal 615 between 800 us and 1.2 ms. Trace 620 shows the offset correction signal (i.e., output signal of the ripple reduction filter 220) that is fed back into the chopped amplifier 200 to correct the offset, and hence reduce the ripple of the chopped amplifier 200. The offset correction signal 620 begins at zero (at time=0) and settles in to about −15 mv at 250 us at which time the ripple reduction filter 220 has properly cancelled most of the chopped amplifier 200's offset. The ripple on the output signal 615 (seen more clearly in zoomed in trace 715 of FIG. 7) is observed to be approximately proportional to the difference of the instantaneous offset correction signal 620 and final offset correction signal value of −15 mv.

Trace 625 shows the output signal of the common-mode detector 325, which goes high to alert the digital controller 330 when a large enough common-mode step is detected. Trace 630 shows the output signal of the slew rate detector 320, which goes high to alert the digital controller 330 when a large enough differential voltage step is detected. Traces 635 and 640 show the mode control outputs from the digital controller 330 to the variable gain sampler 335. It is understood that traces 635 and 640 are not necessarily to scale for a chopping frequency of 200 kHz. For example, while pulse width of traces 635 and 640 would have been 5 us for a 200 kHz chopping frequency, pulse width of traces 635 and 640 shown in FIGS. 6 and 7 are larger than 5 us to make the pulses easier to view. Trace 640 corresponds to the low gain sample control, and a high value for trace 640 indicates that the variable gain sampler 335 is to sample the signal and pass to the integrator 340 in the low gain mode. Trace 635 corresponds to the high gain sample control, and a high value for trace 635 (together with a high value for trace 640) indicates that the variable gain sampler 335 is to sample the signal and pass to the integrator 340 in the high gain mode. When both traces 635 and 640 are low (i.e., no pulse on either trace 635 and trace 640), the variable gain sampler 335 is operated in the blanking mode. To summarize, the three sampling modes are: low gain mode (i.e., pulses only on trace 635), high gain mode (i.e., pulses on both traces 635 and 640) and blanking mode (i.e., no pulses on either trace 635 or trace 640).

The operation of the ripple reduction filter 220 during normal operation to correct for inherent offsets of the chopped amplifier 200 and also during large disturbances may be seen by examining the various traces shown in FIG. 6. At time point t0=0 us, the offset correction signal 620 provides no offset correction, and accordingly the ripple on the output signal 615 is large enough to constantly trigger the high slew rate detector as shown by trace 630. The high slew rate events cause the digital controller 330 to operate the variable gain sampler 335 in the blanking mode until about t1=20 us. After 20 us, the digital controller 330 operates the variable gain sampler 335 in the low gain mode such that the ripple reduction loop will not run effectively in an open loop condition for an extended period of time. The effect of the low gain mode can be seen on the offset correction signal trace 620 as it slowly begins to go negative after 20 us. Between time points t2=50 us and t3=150 us, four common-mode step events occur as shown by trace 605 and those four events are detected by common-mode detector 325 as shown by trace 625. In response to each of the four common-mode steps, the digital controller 330 sets the variable gain sampler 335 in the blanking mode as shown by traces 635 and 640. While it may appear by observing traces 635 and 640 that the blanking mode in response to each of the four common-mode steps is about one clock cycle, the blanking mode may include several clock cycles in reality.

By time point t3=150 us, the offset correction signal 620 has gone sufficiently negative to reduce the output ripple 615 to a magnitude that no longer triggers the high slew rate detector as shown by no activity on trace 630. In response, the digital controller 330 operates the variable gain sampler 335 in the high gain mode (as shown by pulses on both traces 635 and 640) starting at around t3=150 us. By operating the ripple reduction filter 220 in the high gain mode, the output ripple on trace 615 rapidly reduces to a very low level. Also, the slope of the offset correction signal 620 increases between t=150 us and t=200 us while the ripple reduction filter 220 is in the high gain mode. Beyond t5=250 us, it is difficult to see the residual ripple on the output signal 615 or the changes in the offset correction signal 620. The output signal of the chopped amplifier 200 and the offset correction signal are shown on a magnified scale in FIG. 7 to see the change in residual ripple and the changes to the offset signal. FIG. 7 is identical to FIG. 6 except that traces 715 and 720 of FIG. 7 are showing the output signal 615 and the offset correction signal 620 on a magnified scale. Traces 715 and 720 clearly show the reduction in ripple and change in slope of the output signal and the offset correction signal respectively beyond t5=250 us.

The magnified views of the output signal 715 and the offset correction signal 720 in FIG. 7 show the dynamic behavior of the ripple reduction filter 220 and output ripple that results from various disturbances. An example large slew rate event occurs at time point t6=400 us when the differential input signal 610 steps down causing a 1-volt step down on the output signal 715. The bandpass filter 305 and amplitude filter 310 limit the signal seen inside of the ripple reduction filter 220 as a result of this event. The event is detected by the high slew rate detector 320 and shown on trace 630, and the digital controller 330 sets the ripple reduction filter 220 in a blanking mode. After three clock cycles (i.e., about 15 us for chopping frequency of 200 kHz), the digital controller 330 operates the variable gain sampler 335 in the low gain sampling mode during which time the chopped amplifier 200 is allowed to settle from the 1-volt step down event. Once the chopped amplifier 200 has completely settled, which takes another four clock cycles, the digital controller 330 places the variable gain sampler 335 into its normal high gain mode. As a result of the large 1-volt step down event, the output ripple on output signal 715 rises to about 200 uv (i.e., 10 uv input referred due to the amplifier's gain of 20) and is pushed back down to about 30 uv (i.e., 1.5 uv input referred) before the next disturbance hits at time point t=450 us. The offset correction signal 720 shows the activity of the offset correction signal moving slightly around its ideal value in response to the 1-volt step down disturbance. Errors in the offset correction signal 720 result in amplifier offset that is not corrected, which causes the small amount of ripple seen on output signal 715 at about t7=450 us.

Common-mode step disturbances are treated similar to that of high slew rate events except that common-mode steps typically produce shorter blanking periods due the shorter chopped amplifier 200 settling times in response to such disturbances. This can be observed in FIG. 7 after time point t8=800 us as the common-mode signal 605 follows a 100 v square wave to simulate an application of monitoring a PWM system. In response, the common-mode events are detected as shown by trace 625 and the digital controller 330 sets the variable gain sampler 335 in the blanking mode after each detected event. As seen for the event at time point t9=1 ms, the digital controller 330 first sets the variable gain sampler 335 in the blanking mode for two clock cycles (i.e., about 10 us) and then sets the variable gain sampler 335 to resume in high gain operation with both the traces 635 and 640 pulsing as normal. The offset correction signal 720 is disturbed slightly by the common-mode steps causing a small amount of ripple to be apparent on the output signal 715. The ripple reduction filter 220 typically corrects for this additional ripple in the high gain mode before the next disturbance hits.

At time point t10=1.2 ms, a combination of continuous 100v common-mode steps and a repetitive large differential signal event in the form of a 200 mvp-p sine wave input is applied to the chopped amplifier 200. It should be noted that the differential input signal to the amplifier (shown in the trace 610) is 200 mvp-p, while the output of the chopped amplifier 200 Vout (not shown in FIGS. 6 and 7) that is input to the ripple reduction filter 220 is amplified by the amplifier gain of 20 (i.e., 4 vp-p). The combination of 100 v common-mode steps and a 4 vp-p differential signal would have created a very long blanking period if it were not for the digital controller 330 not allowing the ripple reduction filter 220 to be operated in the blanking mode continually. This is seen at time=1.24 ms, (i.e., just before t11=1.25 ms) when a high slew rate event is detected as seen on trace 630 about the time a prior blanking period was ending. Instead of initiating a new blanking period, the digital controller 330 allowed two cycles of low gain sampling in order to maintain closed loop operation. As a result, a small amount of the high slew rate disturbance energy passes both the bandpass filter 305 and the amplitude limiter 310, and creates an error. This error can be seen on offset correction signal 720, where the offset correction signal rises a little over 100 uv at time point t11=1.25 ms in response to the operating the ripple reduction filter 220 in the low sampling mode instead of the blanking mode. The ripple caused by this error is not seen on the output signal 715 as it is far off of the scale of the plot. In a real chopped amplifier system, the ripple in this case is also difficult to see in the time domain as it is superimposed on top of a 4 Vp-p sinewave on the output signal 715. One method to detect such ripple is by using a spectrum analyzer to check the ripple in frequency domain. For any repetitive set of waveforms that force the digital controller 330 to not operate ripple reduction filter 220 in the blanking mode continuously, equilibrium will be reached that will limit the extent of the ripple reduction filter 220's error. By trimming the initial offset of the chopped amplifier 200, the failsafe limit of the offset correction signal 720 is set to a very low level so that repetitive disturbing events can never force a large error onto the ripple reduction filter 220.

Figure 8:
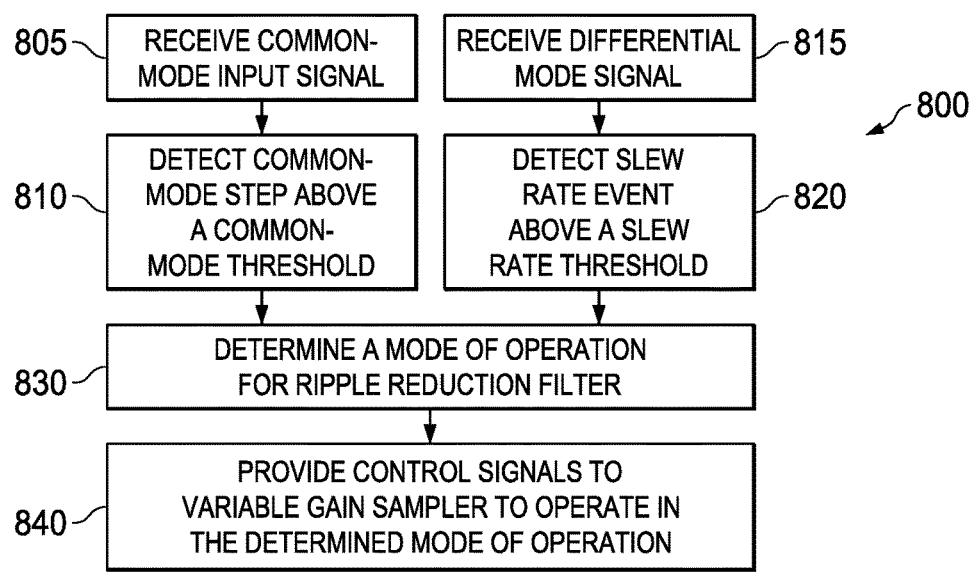
FIG. 8 is a flow chart illustrating a process of operating a ripple reduction filter of FIG. 3 in response to large disturbances, according to one embodiment.

FIG. 8 is a flow chart illustrating a process of operating the ripple reduction filter 220 in response to large disturbances, according to one embodiment. The flow chart depicts various steps performed by the ripple reduction filter 220 for detecting the large disturbing events and to minimize the impact of such disturbances on the operating the ripple reduction filter 220.

The common-mode detector 325 of the ripple reduction filter 220 receives a common-mode input signal of the chopped amplifier 200 for detecting large common-mode steps (805). In some embodiments, the common-mode detector 325 includes a common-mode comparator to detect common-mode steps that are large enough and fast enough to change the biasing and the output response of the chopped amplifier 200. For example, the common-mode detector 325 detects a common-mode step that is larger than a threshold common-mode step (810) as described above with reference to FIG. 3. The common-mode detector 325 provides an output signal to the digital controller 330 indicating whether a common-mode step was detected.

The slew rate detector 320 of the ripple reduction filter 220 receives a differential signal input from input to the output amplifier stage 208 of the chopped amplifier 200 for detecting large slew rate events (815). In some embodiments, the slew rate detector 320 includes a differential comparator to detect slew rate events that are large enough and fast enough to cause the chopped amplifier 200 to slew. For example, the slew rate detector 320 detects a dv/dt event that is larger than a threshold slew rate as described above with reference to FIG. 3 (820). The slew rate detector 320 provides an output signal to the digital controller 330 indicating whether a slew rate event was detected.

The digital controller 330 receives the output signals of the common-mode detector 325 and the slew rate detector 320, and determines a mode of operation for the variable gain sampler 335 (830). The different modes of operation of the variable gain sampler 335 include a blanking mode, a high gain mode, and a low gain mode as described above with reference to FIG. 3. When the digital controller 330 receives an indication that either a slew rate event or a common-mode step is detected, the digital controller 330 determines the mode of operation to be the blanking for a first period of time, then the low gain mode for a second period of time, and finally the high gain mode until the ripple reduction filter 220 experiences another disturbance. Example values for the first and second periods of time are discussed above with reference to the timing diagrams of FIGS. 6 and 7. In some embodiments, the first and second periods of time corresponding to the blanking mode and the low gain mode may be different when a common-mode step is detected as opposed to when the slew rate event is detected. For example, when a common-mode step is detected, the digital controller 330 may operate the variable gain sampler 335 first in the blanking mode for a first period of time and then transitions to the high gain mode without operating in the low gain mode. In other words, the second period of time may be selected as zero when a common-mode step is detected as opposed to a non-zero value when a slew rate event is detected. This difference between the responses to the two kinds of disturbances is described above with reference to the time points t8=800 us and t9=1 ms in FIGS. 6 and 7.

After determining the mode of operation, the digital controller 330 provides the control signals (e.g., low gain sample control signal 635 and high gain control signal 640 of FIGS. 6 and 7) to the variable gain sampler 335 to operate the variable gain sampler 335 in the determined mode (840).

Certain terms are used throughout the description and the claims to refer to particular system components. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A system comprising:
   a chopped amplifier comprising an input terminal, an offset correction terminal, and an output terminal, the chopped amplifier comprising:
      a modulator comprising an input terminal and an output terminal, the input terminal of the modulator coupled to the input terminal of the chopped amplifier,
      an amplifier stage comprising an input terminal, an offset correction terminal, and an output terminal, the input terminal of the amplifier stage coupled to the output terminal of the modulator, the offset correction terminal of the amplifier stage coupled to the offset correction terminal of the chopped amplifier, and
      a demodulator comprising an input terminal and an output terminal, the input terminal of the demodulator coupled to the output terminal of the amplifier stage and the output terminal of the demodulator coupled to the output terminal of the chopped amplifier; and
   a ripple reduction filter comprising an input terminal and an output terminal, the input terminal of the ripple reduction filter coupled to the output terminal of the chopped amplifier and the output terminal of the ripple reduction filter coupled to the offset correction terminal of the chopped amplifier;
   wherein the output terminal of the ripple reduction filter generates a DC signal;
   wherein the ripple reduction filter further comprises:
      a bandpass filter comprising an input terminal and an output terminal, the input terminal of the bandpass filter coupled to the input terminal of the ripple reduction filter; and
      an amplitude limiter comprising an input terminal and an output terminal, the input terminal of the amplitude limiter coupled to the output terminal of the bandpass filter and the output terminal of the amplitude limiter coupled to the output terminal of the ripple reduction filter.

2. The system of claim 1, wherein the ripple reduction filter further comprises:
   a variable gain sampler comprising an input terminal and an output terminal, the input terminal of the variable gain sampler coupled to the output terminal of the amplitude limiter and the output terminal of the variable gain sampler coupled to the output terminal of the ripple reduction filter.

3. The system of claim 2, wherein the ripple reduction filter further comprises:
   an integrator comprising an input terminal and an output terminal, the input terminal of the integrator coupled to the output terminal of the variable gain sampler and the output terminal of the integrator coupled to the output terminal of the ripple reduction filter.

4. The system of claim 2, wherein the ripple reduction filter further comprises:
   a slew rate detector comprising an input terminal and an output terminal, the input terminal of the slew rate detector coupled to the output terminal of the chopped amplifier; and
   a digital controller comprising an input terminal and an output terminal, the input terminal of the digital controller coupled to the output terminal of the slew rate detector and the output terminal of the digital controller coupled to a control terminal of the variable gain sampler.

5. The system of claim 2, wherein the ripple reduction filter further comprises:
   a common-mode detector comprising an input terminal and an output terminal, the input terminal of the common-mode detector coupled to the input terminal of the chopped amplifier; and
   a digital controller comprising an input terminal and an output terminal, the input terminal of the digital controller coupled to the output terminal of the common-mode detector and the output terminal of the digital controller coupled to a control terminal of the variable gain sampler.

6. A system comprising:
   a chopped amplifier comprising an input terminal, an offset correction terminal, and an output terminal; and
   a ripple reduction filter comprising an input terminal and an output terminal, the input terminal of the ripple reduction filter coupled to the output terminal of the chopped amplifier and the output terminal of the ripple reduction filter coupled to the offset correction terminal of the chopped amplifier;
   wherein the output terminal of the ripple reduction filter generates a DC signal;
   wherein the ripple reduction filter further comprises:
      a bandpass filter comprising an input terminal and an output terminal, the input terminal of the bandpass filter coupled to the input terminal of the ripple reduction filter; and
      an amplitude limiter comprising an input terminal and an output terminal, the input terminal of the amplitude limiter coupled to the output terminal of the bandpass filter and the output terminal of the amplitude limiter coupled to the output terminal of the ripple reduction filter.

7. The system of claim 6, wherein the ripple reduction filter further comprises:
   a variable gain sampler comprising an input terminal and an output terminal, the input terminal of the variable gain sampler coupled to the output terminal of the amplitude limiter and the output terminal of the variable gain sampler coupled to the output terminal of the ripple reduction filter.

8. The system of claim 7, wherein the ripple reduction filter further comprises:
   an integrator comprising an input terminal and an output terminal, the input terminal of the integrator coupled to the output terminal of the variable gain sampler and the output terminal of the integrator coupled to the output terminal of the ripple reduction filter.

9. The system of claim 7, wherein the ripple reduction filter further comprises:
   a slew rate detector comprising an input terminal and an output terminal, the input terminal of the slew rate detector coupled to the output terminal of the chopped amplifier; and a digital controller comprising an input terminal and an output terminal, the input terminal of the digital controller coupled to the output terminal of the slew rate detector and the output terminal of the digital controller coupled to a control terminal of the variable gain sampler.

10. The system of claim 7, wherein the ripple reduction filter further comprises:
a common-mode detector comprising an input terminal and an output terminal, the input terminal of the common-mode detector coupled to the input terminal of the chopped amplifier; and
a digital controller comprising an input terminal and an output terminal, the input terminal of the digital controller coupled to the output terminal of the common-mode detector and the output terminal of the digital controller coupled to a control terminal of the variable gain sampler.

11. A ripple reduction filter comprising:
an input terminal configured to receive a portion of an output signal of a chopped amplifier operating at a chopping frequency, the output signal of the chopped amplifier comprising a ripple, the ripple based on an offset voltage of the chopped amplifier;
an output terminal configured to provide a feedback signal to the chopped amplifier, the feedback signal modifying the offset voltage of the chopped amplifier;
a bandpass filter coupled to the input terminal, the bandpass filter configured to attenuate signals outside of a range of frequencies associated with the chopping frequency; and
an amplitude limiter coupled to the bandpass filter and the output terminal, the amplitude limiter configured to receive an output signal of the bandpass filter and configured to amplify the output signal of the bandpass filter for signals having an amplitude below a predetermined threshold at a first level and not amplifying the output signal of the bandpass filter that exceeds the predetermined threshold, the amplitude limiter further configured to provide a signal corresponding to the limited ripple amplitude as the feedback signal.

12. The ripple reduction filter of claim 11 further comprising:
a variable gain sampler coupled to the amplitude limiter and the output terminal, the variable gain sampler configured to receive the limited ripple amplitude signal and sample the limited ripple amplitude signal to provide a signal corresponding to the sampled limited ripple amplitude signal as the feedback signal.

13. The ripple reduction filter of claim 12 further comprising:
an integrator coupled to the variable gain sampler and the output terminal, the integrator configured to receive the sampled limited ripple amplitude signal and integrate the sampled limited ripple amplitude signal to provide a signal corresponding to the integrated sampled limited ripple amplitude signal as the feedback signal.

14. The ripple reduction filter of claim 12 further comprising:
a slew rate detector coupled to the input terminal, the slew rate detector configured to receive a differential signal corresponding to an output amplifier stage of the chopped amplifier, detect a slew rate event associated with the received differential signal, and provide an indication to a digital controller whether the slew rate event is detected, the slew rate detector further configured to detect the slew rate event if a slew rate of the differential signal is above a threshold slew rate.

15. The ripple reduction filter of claim 14 further comprising:
a common-mode detector coupled to an input terminal, the common-mode detector configured to receive a common-mode signal corresponding to an input signal of the chopped amplifier, detect a common-mode step associated with the received common-mode signal, and provide an indication to the digital controller whether the common-mode step is detected, the common-mode detector further configured to detect the common-mode step if a change in common-mode value of the common-mode signal is larger than a threshold common-mode step.

16. The ripple reduction filter of claim 15 further comprising:
the digital controller coupled to the variable gain sampler, the digital controller configured to receive an indication whether at least one of: the common-mode step and the slew rate event is detected, the digital controller further configured to determine a mode of operation for the variable gain sampler based on the received indication.

17. The ripple reduction filter of claim 16, wherein the mode of operation for the variable gain sampler is at least one of: a blanking mode; a low gain mode; and a high gain mode, wherein the feedback signal does not change when the variable gain sampler is operated in the blanking mode.

18. The ripple reduction filter of claim 16, wherein the variable gain sampler is operated in the blanking mode in response to detecting at least one of: the slew rate event and the common-mode step.

19. The ripple reduction filter of claim 13 further comprising:
an offset correction limiter coupled to the integrator and the output terminal, the offset correction limiter configured to receive the integrated sampled limited ripple amplitude signal and limit a range of the integrated sampled limited ripple amplitude signal to provide a signal corresponding to the limited range integrated sampled limited ripple amplitude signal as the feedback signal.

* * * * *